United States Patent

Park et al.

[11] Patent Number: 5,096,847
[45] Date of Patent: Mar. 17, 1992

[54] METHOD MAKING AN ULTRA HIGH DENSITY DRAM CELL WITH STACKED CAPACITOR

[75] Inventors: In-seon Park, Kwang ju; Su-han Choi, Kyunggi-do, both of Rep. of Korea

[73] Assignee: Samsung Electronics Co., Ltd., Suweon, Rep. of Korea

[21] Appl. No.: 489,820

[22] Filed: Mar. 9, 1990

[30] Foreign Application Priority Data

Dec. 2, 1989 [KR] Rep. of Korea ............... 89-17829

[51] Int. Cl.$^5$ ............................................. H01L 21/70
[52] U.S. Cl. ................................. 437/52; 437/47; 437/48; 437/60; 437/228; 437/919
[58] Field of Search ............... 437/47, 51, 52, 60, 437/193, 195, 228, 233, 235, 919; 351/51, 23.6; 365/174

[56] References Cited

U.S. PATENT DOCUMENTS

| | | | |
|---|---|---|---|
| 4,685,197 | 8/1987 | Tigelaar et al. | 437/245 |
| 4,700,457 | 10/1987 | Matsukawa | 437/245 |
| 4,910,566 | 3/1990 | Ema | 357/51 |

FOREIGN PATENT DOCUMENTS

| | | | |
|---|---|---|---|
| 0074470 | 4/1985 | Japan | 357/23.6 |
| 0052959 | 3/1987 | Japan | 357/23.6 |
| 0038252 | 2/1988 | Japan | 437/52 |
| 0095709 | 12/1988 | Japan | 357/23.6 |
| 0100960 | 4/1989 | Japan | 357/23.6 |
| 0147858 | 6/1989 | Japan | 357/23.6 |

*Primary Examiner*—Brian E. Hearn
*Assistant Examiner*—Tom Thomas
*Attorney, Agent, or Firm*—Cushman, Darby & Cushman

[57] ABSTRACT

An ultra high integration DRAM cell and a method of manufacturing therefor are provided which increases the capacitance of the cell capacitor. The plate electrode consists of the second and fourth polycrystalline silicon layers; the storage electrode consists of the third polycrystalline silicon layer; the dielectric layer is increased by the area of the first dielectric layer.

6 Claims, 2 Drawing Sheets

METHOD MAKING AN ULTRA HIGH DENSITY DRAM CELL WITH STACKED CAPACITOR

FIELD OF THE INVENTION

The present invention relates to a DRAM cell and a manufacturing method therefor. In particular, the invention relates to an ultra high integration DRAM cell in which a stacked storage capacitor structure is provided, and a manufacturing method therefor.

BACKGROUND OF THE INVENTION

A DRAM cell consists of a transistor having a drain-source passage connected between a bit line and a cell node, and a storage capacitor connected between the cell node and a cell plate. As the memory density of the DRAM is increased, the area occupied by the DRAM cell is proportionately reduced. Accordingly, the capacitance of the storage capacitor is decreased. Therefore, in an attempt to maximize the capacitance of the storage capacitor, three dimensional DRAM cells such as those having a trenched structure or a stacked structure have been developed. The storage capacitor in the trenched structure is formed in a groove in the semiconductor substrate; the stacked storage capacitor in the stacked structure is stacked upon the semiconductor substrate.

The stacked capacitor type DRAM cell is manufactured by stacking the capacitor upon the semiconductor substrate; therefore, it is advantageous in that it can be manufactured more easily than the trenched capacitor type DRAM cell. Furthermore, the stacked capacitor type DRAM cell does not have electrical problems such as punch-through and current leakage between a trenches and a trench, which are present in the trenched capacitor type DRAM cell.

FIG. 1 is a vertical sectional view of a conventional stacked type DRAM cell. The construction of this conventional stacked type DRAM cell will be briefly described below.

A P type well 2 is formed upon a P type substrate 1. A field oxide layer 4 is formed to isolate or to separate the memory cells from each. A P+ channel stopper layer 3 is formed under the field oxide layer 4. Thereafter, a gate oxide layer 5 is formed, and an N+ impurity doped polycrystalline silicon layer 6, which is to serve as a gate electrode of a switching transistor is formed on the gate oxide layer 5. Then, on the field oxide layer 4, a polycrystalline silicon layer 7 which is to serve as a gate electrode of an adjacent memory cell. Then, an N+ source region 8 and an N+ drain region 9 of the switching transistor are formed, and an insulating layer 11 is formed to insulate the polycrystalline silicon layers 6,7.

Then, an N+ doped polycrystalline silicon layer 12 which is to serve as an electrode of the storage capacitor is formed on the insulating layer 11 such that it overlaps the polycrystalline silicon layers 6,7, and also contacts a portion of the source region 8.

The dielectric layer 13 of the storage capacitor is formed on the surface of the polycrystalline silicon layer 12. On the dielectric layer 13, an N+ doped polycrystalline silicon layer 14 is formed to serve as another electrode of the storage capacitor is formed. An insulating layer 15 is formed upon the polycrystalline layer 14. On the insulating layer 15, a conductive layer 16 is formed to serve as a bit line, which also contacts the drain region 9.

In such a conventional stacked capacitor type cell structure, the cell area is reduced as the density of the DRAM memory is increased; therefore, the capacitance of the capacitor would be decreased. Consequently, the density of this conventional stacked capacitor type DRAM cell is confined to the order of 4M. Accordingly, if the ultra high integration DRAM cells of 16M or 64M are to be realized, the capacitance of the capacitor has to be increased. In an effort to provide a solution to that problem, brisk research is ongoing in the relevant field.

SUMMARY OF THE INVENTION

The present invention is intended to overcome the above described problem associated with the conventional technique.

It is an object of the present invention to provide an ultra high integration DRAM cell in which a capacitor of a sufficient capacitance is provided through an increase of the capacitor area.

It is another object of the present invention to provide a manufacturing method which is suitable for manufacturing the above-mentioned ultra high integration DRAM cell.

For achieving the above objects, the ultra high integration DRAM cell of the present comprises: a semiconductor substrate of a first conduction type; respective source and drain regions of a second conduction type formed in the substrate and isolated from each other by a channel region in the substrate; a field oxide layer formed on a region of the substrate adjacent one end of the source region (another end of the source region is adjacent to the channel region); a gate oxide layer formed over the channel region; respective first polycrystalline silicon layers, one formed on the gate oxide layer and another on the field oxide layer; an insulating layer formed on the substrate for isolating the respective first polycrystalline silicon layers; respective second polycrystalline silicon layers formed on said insulating layer, each overlapping a corresponding one of the first polycrystalline silicon layer; a third polycrystalline silicon layer formed on an area of the substrate including the source region, overlapping the second polycrystalline silicon layers through a first dielectric layer; a fourth polycrystalline silicon layer formed on the substrate and overlapping the third polycrystalline silicon layer through a second dielectric layer formed therebetween (the fourth polycrystalline silicon layer is connected to each second polycrystalline silicon layer).

For achieving the above objects, a manufacturing method according to the present invention comprises the steps of: forming a field oxide layer on a region of a semiconductor substrate of a first conduction type, to define a switching transistor region of the substrate; forming a source region adjacent to the field oxide layer, within the switching transistor region, and a drain region within the switching transistor region (the source and drain regions are isolated by a channel region within the switching transistor region); forming a gate oxide layer on the channel region; forming respective first polycrystalline silicon layers on the substrate, one on the gate oxide layer and another on a predetermined portion of the field oxide layer; forming an insulating layer on the substrate for electrically insulating the respective first polycrystalline silicon layers from each other; forming respective second polycrystalline silicon layers on the insulating layer, each overlapping a corresponding one of the first polycrystalline silicon layer; forming a first dielectric layer on each second polycrystalline silicon layer; forming a third polycrystalline silicon layer on an area of the substrate including the source region such that it overlaps the respective second polycrystalline silicon layers through the first dielectric layer; forming a second dielectric layer on the third polycrystalline silicon layer; forming a fourth polycrystalline silicon layer on the substrate such that is overlaps the third polycrystalline silicon layer through the second dielectric layer.

BRIEF DESCRIPTION OF THE DRAWINGS

The above objects and other advantages of the present invention will become more apparent by the following description of the preferred embodiment of the present invention with reference to the attached drawing in which.

DETAILED DESCRIPTION OF THE PREFERRED EMBODIMENT

Figure 1:
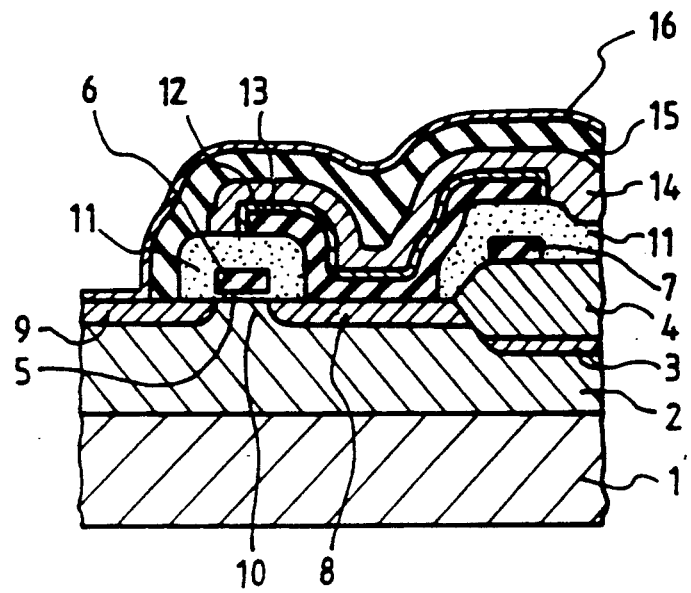
FIG. 1 is a sectional view of a conventional DRAM cell provided with a stacked capacitor.
Figure 2:
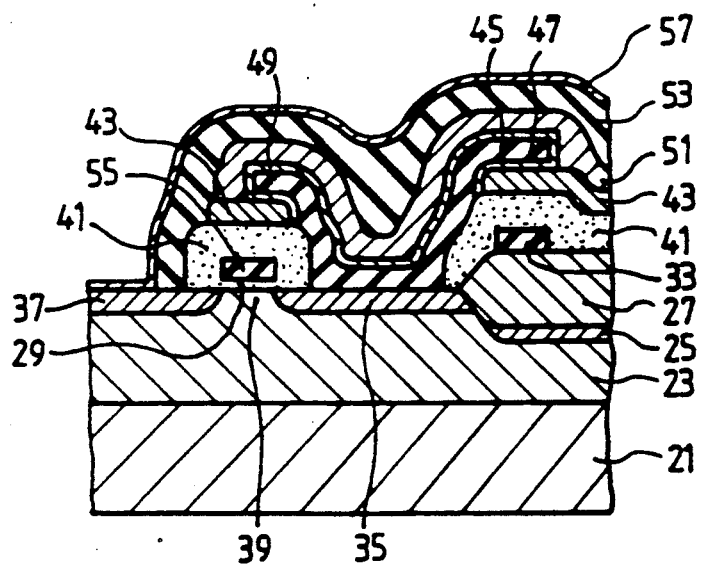
FIG. 2 is a sectional view of a stacked capacitor type DRAM cell according to an embodiment of the present invention.

FIG. 2 is a sectional view of a DRAM cell provided with a stacked capacitor according to a preferred embodiment of the present invention.

With reference to FIG. 2, semiconductor substrate 21 is a P type substrate, and has a P type well region 23 formed at the upper portion thereof. A field oxide layer 27 is formed on the P type well region 23, and a P+ channel stopper layer is formed under the field oxide layer 27.

A source region 35 is formed adjacent one end of the field oxide layer 27, and a drain region 37 is formed in an area isolated from the source region 35 by means of a channel region 39. The source and drain regions 35, 37 are N type regions, and the channel region 39 electrically connects the source and drain regions 35, 37 together. A first polycrystalline silicon layer 31 which serves as a gate electrode is formed over the channel region 39, with a gate oxide layer 29 being interposed therebetween, and another first polycrystalline silicon layer 33 which serves as a gate electrode of an adjacent transistor is formed on the field oxide layer 27. The first polycrystalline silicon layers 31,33, are electrically insulated from each other by means of an insulating layer 41. The insulating layer 41 may be composed of a low temperature oxide (LTO).

A third polycrystalline silicon layer 47 which serves an electrode of the storage capacitor is formed on the exposed surface of the source region 35, and a second dielectric layer 49 which serves as a dielectric medium is formed on the surface of the third polycrystalline silicon layer 47. Further, a fourth polycrystalline silicon layer 51 which serves as portions of a plate electrode of the capacitor is formed on the surface of the second dielectric layer 49.

Furthermore, on the insulating layer 41 which is composed of a low temperature oxide (LTO) and which is for electrically insulating the first polycrystalline silicon layers 31,33, second polycrystalline silicon layers 43 which are used as additional portions of the plate electrode of the capacitor are formed.

The second polycrystalline layers 43 are electrically connected to the fourth polycrystalline silicon layer 51, and are insulated from the third polycrystalline silicon layer 47 by means of a first dielectric layer 45 which is used as a dielectric medium. The first and second dielectric layers 45,49, may be composed of an oxide or an oxide-nitride-oxide (ONO).

Figure 3A:
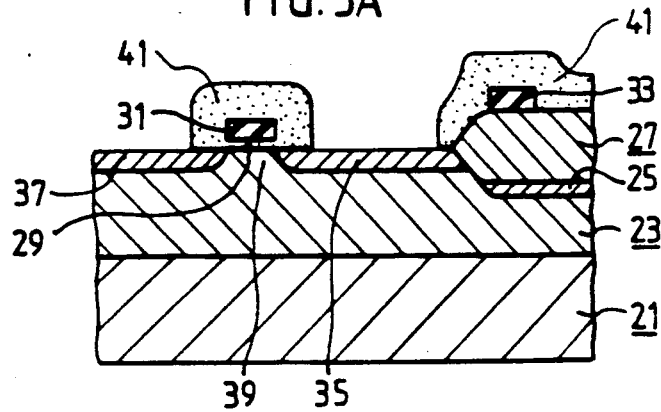
FIGS. 3A to 3C are sectional views showing the manufacturing processes of the DRAM cell of FIG. 2.
Figure 3B:
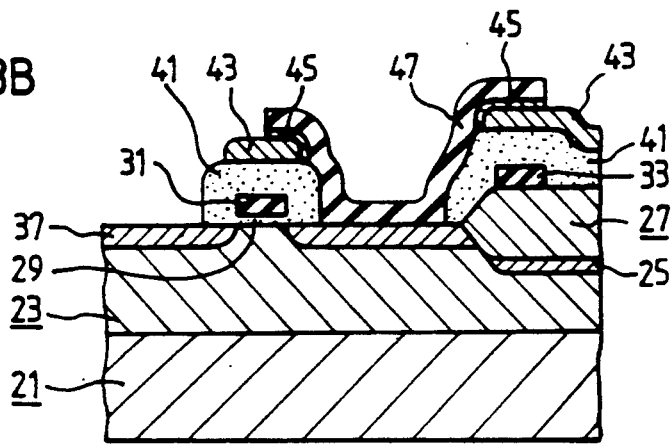
Figure 3C:
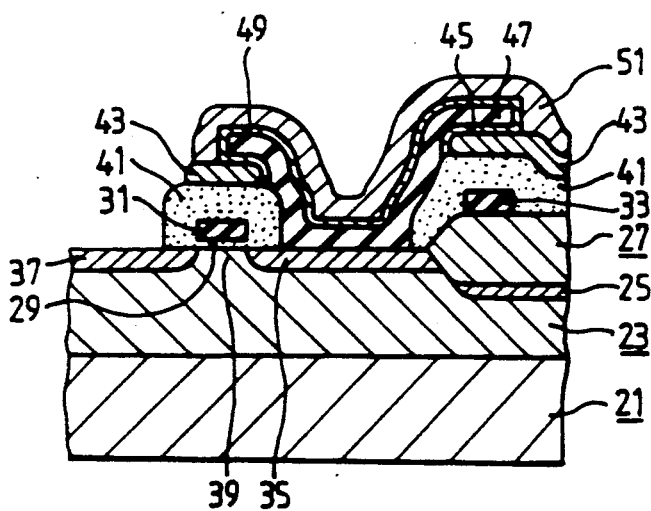

FIGS. 3A to 3C are sectional views showing the manufacturing processes for the stacked capacitor type DRAM cell in FIG. 2. It should be noted that the same reference codes in FIGS. 2 and 3A to 3C indicate the same parts. Referring to FIG. 3A, there is formed a P type well region 23 which is formed on a P type substrate 21 having a resistance of 18 $\omega$ —cm, and a direction of 100, and which has an —ion concentration of about $10^{\neq}ion/cm^3$ and a depth of 4 $\mu$m.

Based on the usual manufacturing process for N channel MOS transistors, a thick field oxide layer 27 is formed by applying a LOCOS (local oxidation of silicon) method. Under this condition, a P+ channel stopper layer 25 is formed under the field oxide layer 27. Then, the gate oxide layer 29 having a thickness of 100-200Å is formed on the surface of a P type well region 23 which is disposed adjacently to the field oxide layer 27, and the first polycrystalline silicon layer 31 having a thickness of 2000-3000Å and to be used as a gate electrode of the transistor and doped with an N+ impurity is formed. Under this condition, the N+ doped first polycrystalline silicon layer 33 which serves as a gate electrode of an adjacent memory cell is formed on the field oxide layer 27.

Then, the N+ source and drain regions 35,37 are formed by an ion-implantation method, and under this condition, the surface of a the P type well region 23 between the drain and source regions 35, 37, becomes the channel region 39.

Next, the insulating layer 41 is formed with a thickness of 2500-3000Å on the surface of the above described structure by a chemical vapor deposition method (CVD). Insulating layer 41 may be composed of an LTO film.

It should be noted that the above-described manufacturing method for a MOS transistor is well known, and the above-described N channel MOS transistor may be formed directly on the substrate.

With respect to FIG. 3B, N+ doped second polycrystalline silicon layers 43 are selectively formed with a thickness of 1000-2500Å on the insulating layer 41, overlapping the first polycrystalline silicon layers 31,33, respectively, to be used as portions of the plate electrode of the capacitor. An ONO (oxide-nitride-oxide) layer 45 is formed with a thickness of 60-200Å on the whole surface of the above-described structure, and then, predetermined portions of the source and drain regions 35,37 are exposed by a photo etching method.

An N+ doped third polycrystalline silicon layer 47 is selectively formed on the above-described structure such that; it contacts the source region 35. Layer 47 is to be used as an electrode of the storage capacitor.

Referring to FIG. 3C, an ONO layer is formed with a thickness of 60-200Å on the above-described structure. Then, the ONO layer is removed except the portion which lies on the surface of the third polycrystalline silicon layer 47.

Then, a fourth polycrystalline silicon layer 51 is selectively formed in a thickness of 1000-2500Å, and the fourth polycrystalline silicon layer 51 and the second polycrystalline silicon layer 43 are electrically connected to each other to be used as the plate electrode of the capacitor.

Furthermore, the ONO layer between the second and third polycrystalline silicon layers 43,47, serves as the first dielectric layer 45, and the ONO layer between the third and fourth polycrystalline silicon layers 47,51, serves as the second dielectric layer 49; the first and second dielectric layers 45,49, are connected to each other.

Then, a BPSG (boro-phospho silicate glass) layer 53 is formed with a thickness of 3000-5000Å on the above-described structure for flattening the surface, and an opening 55 is formed by a photo etching method to expose a predetermined portion of the drain region 37. The BPSG layer is shown in FIG. 2.

Then a metal silicide layer 57 is selectively formed such that it contacts the drain region 37. The BPSG layer 53 provided for flattening the surface may be substituted by a PSG (phospho silicate glass) layer, and the metal silicide layer 57 may be composed of W or Ti silicide, to serve as a bit line. The metal silicide layer is shown in FIG. 2.

As described above, the plate electrode of the capacitor consists of the second and fourth polycrystalline silicon layers 43,51, and the storage electrode of the capacitor consists of the third polycrystalline silicon layer 47. Accordingly, the dielectric layer is increased as much as the area of the first dielectric layer 45 which is disposed on the overlapped portion of the second and third polycrystalline silicon layers 43,47.

Thus, according to the present invention, the surface area of the capacitor is increased, and the capacitance of the capacitor is increased, thereby permitting greater reduction in the size of the memory cell.

We claim:

1. A method for manufacturing a DRAM cell, comprising the following steps:
   forming a field oxide layer on a region of a semiconductor substrate of a first conduction type, to define a switching transistor region of the substrate;
   forming a source region adjacent to said field oxide layer, within said switching transistor region, and a drain region within said switching transistor region; said source and drain regions being isolated by a channel region within said switching transistor region;
   forming a gate oxide layer on said channel region;
   forming respective first polycrystalline silicon layers on said substrate, one on said gate oxide layer and another on a predetermined portion of said field oxide layer;
   forming an insulating layer on said substrate for electrically insulating said respective first polycrystalline silicon layers from each other;
   forming respective second polycrystalline silicon layers on said insulating layer, each overlapping a corresponding said first polycrystalline silicon layer;
   forming a first dielectric layer on each of said second polycrystalline silicon layers;
   forming a third polycrystalline silicon layer on an area of said substrate including said source region such that said third polycrystalline silicon layer overlaps said respective second polycrystalline silicon layers through said first dielectric layer and contacts said source region;
   forming a second dielectric layer on said third polycrystalline silicon layer;
   forming a fourth polycrystalline silicon layer on said substrate such that said fourth polycrystalline silicon layer overlaps said third polycrystalline silicon layer through said second dielectric layer and contacts said respective second polycrystalline silicon layers.

2. A method for manufacturing a DRAM cell as recited in claim 1, wherein:
said first and second dielectric layers are connected to each other along edges of said third polycrystalline silicon layer; said connected dielectric layers along said edges also isolating said third polycrystalline silicon layer from said fourth polycrystalline silicon layer.

3. A method as recited in claim 1, wherein:
said first and second dielectric layers are each composed of an oxide-nitride-oxide layer.

4. A method as recited in claim 1, wherein:
each said first, second, third, and fourth polycrystalline silicon layer is doped with a high concentration impurity of said second conduction type.

5. A method as recited in claim 1, further comprising the steps of:
forming a BPSG layer on said fourth polycrystalline silicon layer;
forming an opening to expose a portion of said drain region; and
forming a metal silicide layer on said substrate, overlapping said BPSG layer and contacting said exposed portion of the drain region.

6. A method as recited in claim 1, wherein said metal silicide layer is composed of either W silicide or Ti silicide.

* * * * *